United States Patent
Hsieh et al.

(10) Patent No.: US 8,487,290 B2
(45) Date of Patent: Jul. 16, 2013

(54) RRAM WITH IMPROVED RESISTANCE TRANSFORMATION CHARACTERISTIC AND METHOD OF MAKING THE SAME

(75) Inventors: Chun-I Hsieh, Hsinchu (TW); Chang-Rong Wu, Taipei County (TW); Neng-Tai Shih, Taipei (TW); Kou-Chen Liu, Taoyuan County (TW)

(73) Assignee: Nanya Technology Corp., Kueishan, Tao-Yuan Hsien (TW)

( * ) Notice: Subject to any disclaimer, the term of this patent is extended or adjusted under 35 U.S.C. 154(b) by 786 days.

(21) Appl. No.: 12/324,841

(22) Filed: Nov. 27, 2008

(65) Prior Publication Data
US 2010/0072449 A1    Mar. 25, 2010

(30) Foreign Application Priority Data

Sep. 25, 2008 (TW) ................ 97136838 A

(51) Int. Cl.
*H01L 47/00* (2006.01)

(52) U.S. Cl.
USPC .................. 257/4; 257/E45.002; 438/104

(58) Field of Classification Search
USPC ................ 257/4, E45.002; 438/104
See application file for complete search history.

(56) References Cited

U.S. PATENT DOCUMENTS

2007/0200158 A1* 8/2007 Genrikh et al. ............... 257/306

FOREIGN PATENT DOCUMENTS

| CN | 1810810 A | 8/2006 |
|---|---|---|
| CN | 1881649 A | 12/2006 |
| TW | 200840020 | 10/2008 |

OTHER PUBLICATIONS

Ho et al. "A Highly Reliable Self-Aligned Graded Oxide WOx Resistance Memory Conduction Mechanisms and Reliability," 2007 Symposium on VLSI Technology Digest Technical Paper, 2007.*

Zeghbroeck, Principle of Semiconductor Devices,: Chapter 3, http://ecee.colorado.edu/~bart/book/welcome.htm, 2007.*

Kim et al. Effect of Ultraviolet-ozone treatment of idium-tin-oxide of electrical properties of organic light emitting diodes, J Apl. Phys. 93, 2560, 2004.*

* cited by examiner

*Primary Examiner* — Matthew Reames
(74) *Attorney, Agent, or Firm* — Winston Hsu; Scott Margo

(57) ABSTRACT

A method for fabricating an RRAM is provided. First, a bottom electrode is formed. A resistive layer is formed on the bottom electrode. A top electrode is then formed on the resistive layer, wherein the top electrode is selected from the group consisting of indium tin oxide (ITO) and indium zinc oxide (IZO). Finally, the top electrode is irradiated with UV light.

16 Claims, 8 Drawing Sheets

RRAM WITH IMPROVED RESISTANCE TRANSFORMATION CHARACTERISTIC AND METHOD OF MAKING THE SAME

BACKGROUND OF THE INVENTION

1. Field of the Invention

The present invention relates to an RRAM structure and a method of making the same, and more particularly, to an RRAM structure with improved resistance transformation characteristic and a method of making the same.

2. Description of the Prior Art

A semiconductor memory array structure may include a plurality of interconnected memory cells, such as DRAM, MRAM, FRAM and RRAM. An RRAM stores data using the variable resistance characteristic of a resistive layer.

FIG. 1 is a graph illustrating an I-V curve of an ideal RRAM. As shown in FIG. 1, when an ideal RRAM is in a set state, such as in a $V_{set}$ voltage, the resistance of the RRAM may vary from a high resistance state to a low resistance state. When an ideal RRAM is in a reset state, such as in a $V_{reset}$ voltage, as the voltage increases, the current will decrease dramatically. That is, the resistance of the RRAM will vary from a low resistance state to a high resistance state. Generally speaking, the I-V curve of an ideal RRAM in the low resistance state and the high resistance state should not overlap each other.

However, for a conventional RRAM, I-V curves of the low resistance state and of the high resistance state have large variations. Therefore, the I-V curve of the low resistance state may overlap that of the high resistance state, causing difficulty in signal analysis.

Accordingly, an RRAM with improved resistance transformation characteristic is required to provide reliable signal processing.

SUMMARY OF THE INVENTION

It is therefore one objective of the present invention to provide a novel RRAM structure with improved resistance transformation characteristic and a method of making the same in order to overcome the above-mentioned problem.

According to a preferred embodiment of the present invention, an RRAM structure includes: a bottom electrode; a top electrode positioned above the bottom electrode, wherein the top electrode is selected from the group consisting of indium tin oxide (ITO), indium zinc oxide (IZO) and palladium (Pd); and a resistive layer sandwiched between the bottom electrode and the top electrode.

According to another preferred embodiment of the present invention, a method of fabricating an RRAM includes: forming a bottom electrode; forming a resistive layer on the bottom electrode; forming a top electrode on the resistive layer, wherein the top electrode is selected from the group consisting of indium tin oxide (ITO) and indium zinc oxide (IZO); and irradiating the top electrode with UV light.

According to applicants' research, the resistance transformation characteristic of an RRAM can be increased after irradiating the transparent top electrode with UV light. Furthermore, the resistance transformation characteristic of an RRAM can also be increased by utilizing Pd as the top electrode.

These and other objectives of the present invention will no doubt become obvious to those of ordinary skill in the art after reading the following detailed description of the preferred embodiment that is illustrated in the various figures and drawings.

DETAILED DESCRIPTION

Figure 2:
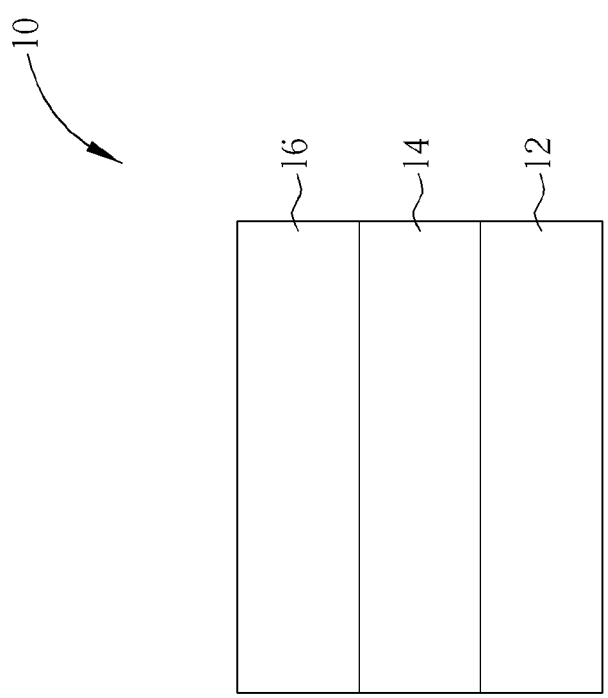
FIG. 2 to FIG. 3 illustrates a method of fabricating an RRAM according to a preferred embodiment of the present invention.
Figure 3:
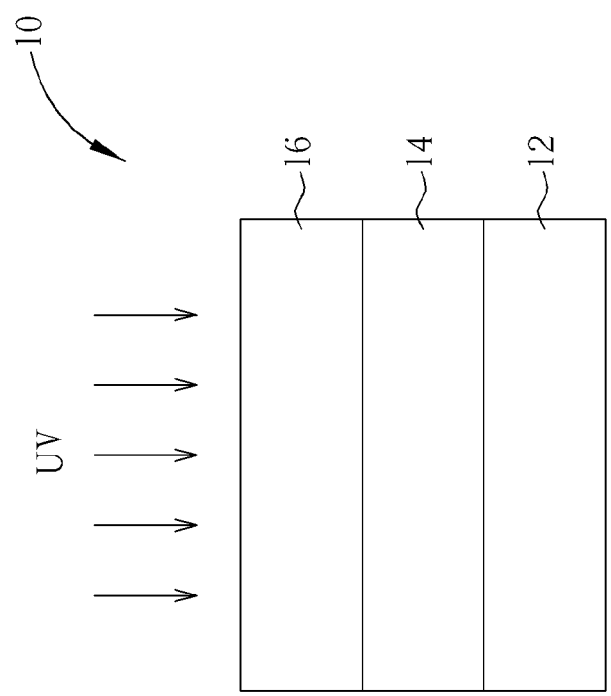

FIG. 2 to FIG. 3 illustrates a method of fabricating an RRAM according to a preferred embodiment of the present invention.

The method of fabricating an RRAM according to a preferred embodiment of the present invention will now be described in detail. As shown in FIG. 2, first, a bottom electrode 12 is formed on a lower structure (not shown) such as a substrate. Then, a resistive layer 14 is formed on the bottom electrode 12 and a top electrode 16 is formed on the resistive layer 14. The bottom electrode 12, the resistive layer 14 and the top electrode 16 constitute an RRAM 10. The bottom electrode 12 is selected from the group consisting of Ti, TiN, Ta, W, WN, Pt, Au, Cu, AlCu or other conductive materials. A conductive material consisting of no oxygen is a preferable material for the bottom electrode 12. The resistive layer 14 is selected from the group consisting of TiO, NiO, $WO_3$, ZrO, CuO, HfO, TaO, ZnO, $Al_2O_3$, MoO and other dielectric materials. The resistive layer 14 may be a single layer or a stack structure comprising at least two different dielectric materials. Furthermore, a barrier (not shown) may be formed between the bottom electrode 12 and the resistive layer 14 so as to increase the affinity between the bottom electrode 12 and the resistive layer 14.

After that, as shown in FIG. 3, the RRAM 10, especially the top electrode 16 of the RRAM 10, is irradiated with UV light. According to a preferred embodiment of the present invention, the wavelength of the UV light is preferably about 365 nm, and the irradiating time of the RRAM 10 is preferably between 30 and 60 seconds. At this point, the RRAM 10 with improved resistance transformation is finished.

It is worthy of note that the material of the top electrode 16 is ITO, IZO or other transparent conductive materials. After irradiating the RRAM 10 with UV light, dangling bonds are formed at the interface between the top electrode 16 and the resistive layer 14, and oxygen ions can therefore move freely at the interface. In this way, the resistance transformation characteristic is improved.

Figure 4:
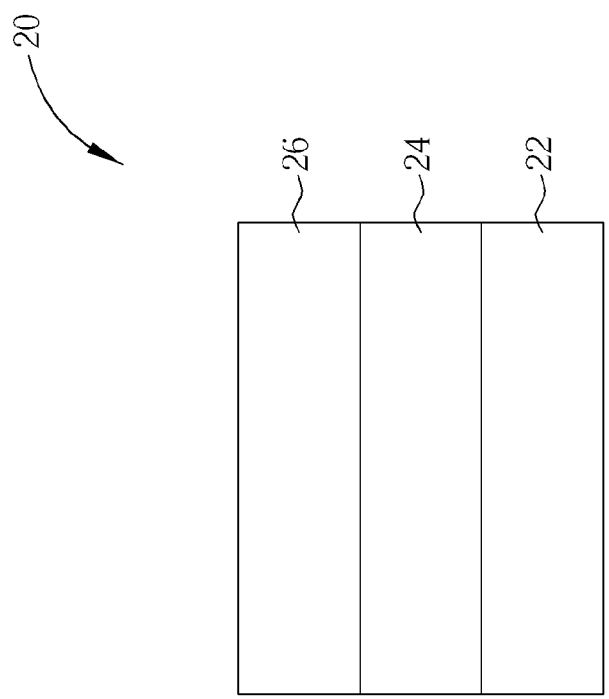
FIG. 4 shows an RRAM structure according to a preferred embodiment of the present invention.

An RRAM structure is also provided in the present invention. As shown in FIG. 4, an RRAM structure 20 includes a bottom electrode 22, a top electrode 26 positioned above the bottom electrode 22, and a resistive layer 24 sandwiched between the bottom electrode 22 and the top electrode 26. The top electrode 26 is selected from the group consisting of indium tin oxide (ITO), indium zinc oxide (IZO) and palladium (Pd)

According to a preferred embodiment, an RRAM 20 using ITO or IZO as the top electrode 26 will have a better resistance transformation characteristic after irradiating the top electrode 26 with UV light when the RRAM 20 is constructed. An RRAM 20 using Pd as the top electrode 26, however, has a good resistance transformation characteristic, even without irradiation of the RRAM 20 with UV light. The bottom electrode 22 is selected from the group consisting of Ti, TiN, Ta, W, WN, Pt, Au, Cu, AlCu or other conductive materials. A conductive material consisting of no oxygen is a preferable material for the bottom electrode 22. The resistive layer 24 is selected from the group consisting of TiO, NiO, WO$_3$, ZrO, CuO, HfO, TaO, ZnO, Al$_2$O$_3$, MoO and other dielectric materials. The resistive layer 24 may be a single layer or a stack structure comprising at least two different dielectric materials. Furthermore, a barrier (not shown) may be formed between the bottom electrode 22 and the resistive layer 24 so as to increase the affinity between the bottom electrode 22 and the resistive layer 24.

Figure 5:
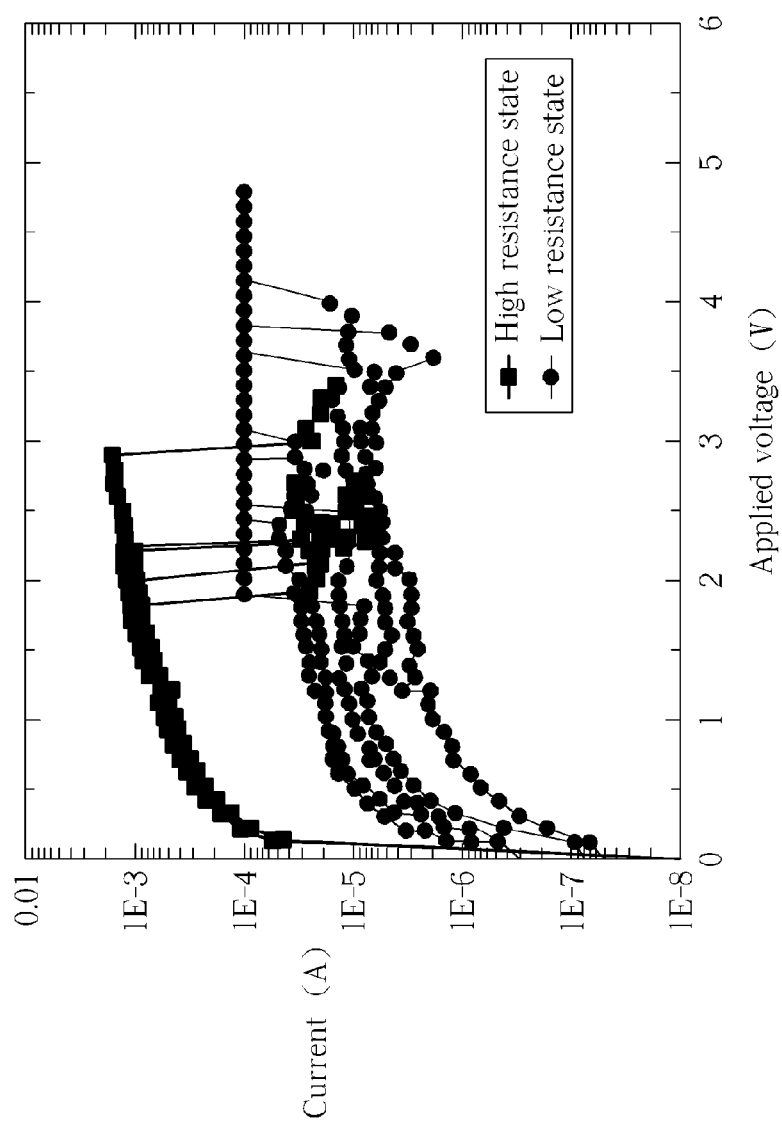
FIG. 5 is a graph illustrating an I-V curve of an RRAM using ITO without irradiation with UV light as the top electrode.
Figure 6:
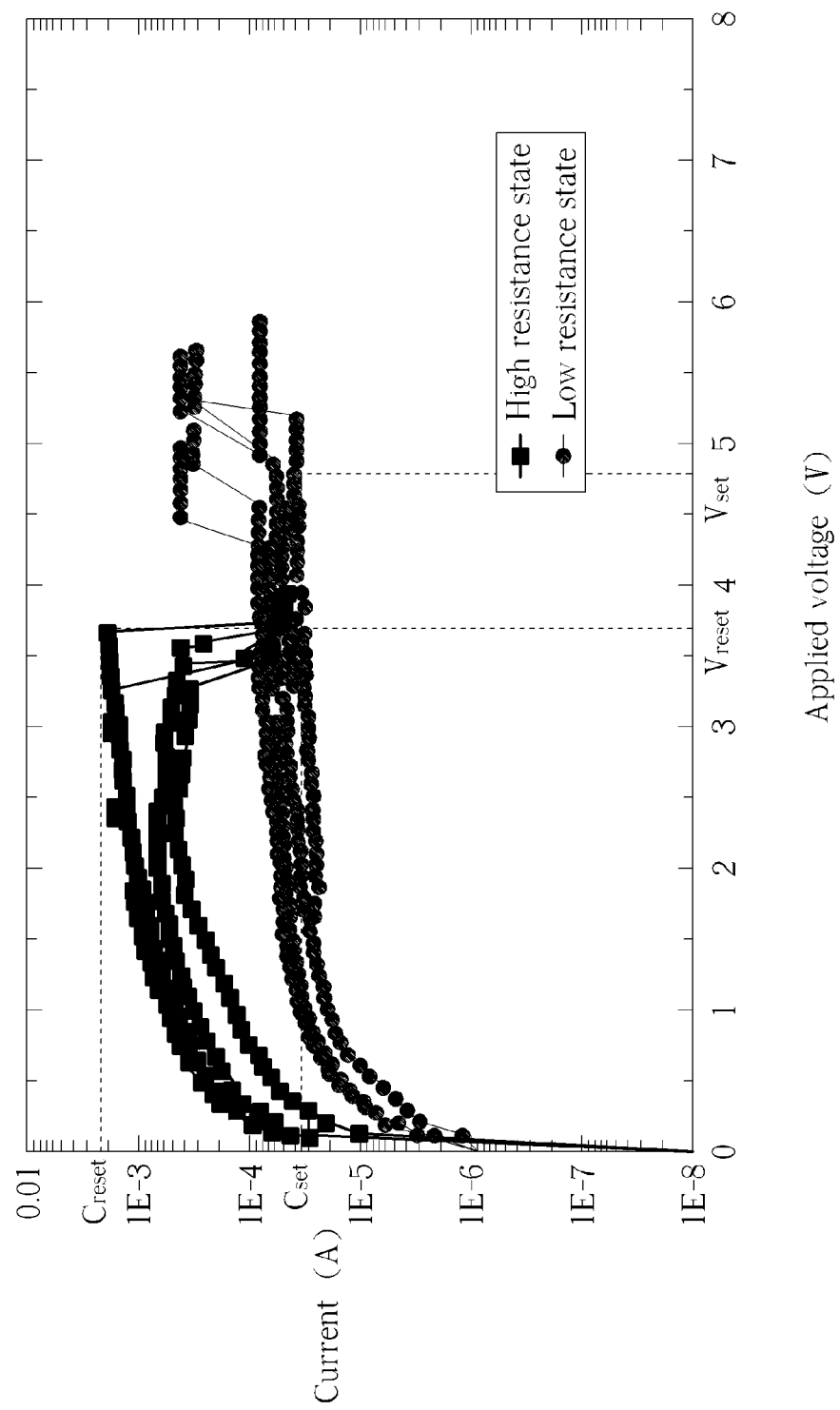
FIG. 6 is a graph illustrating an I-V curve of an RRAM using ITO irradiated with UV light as the top electrode.
Figure 7:
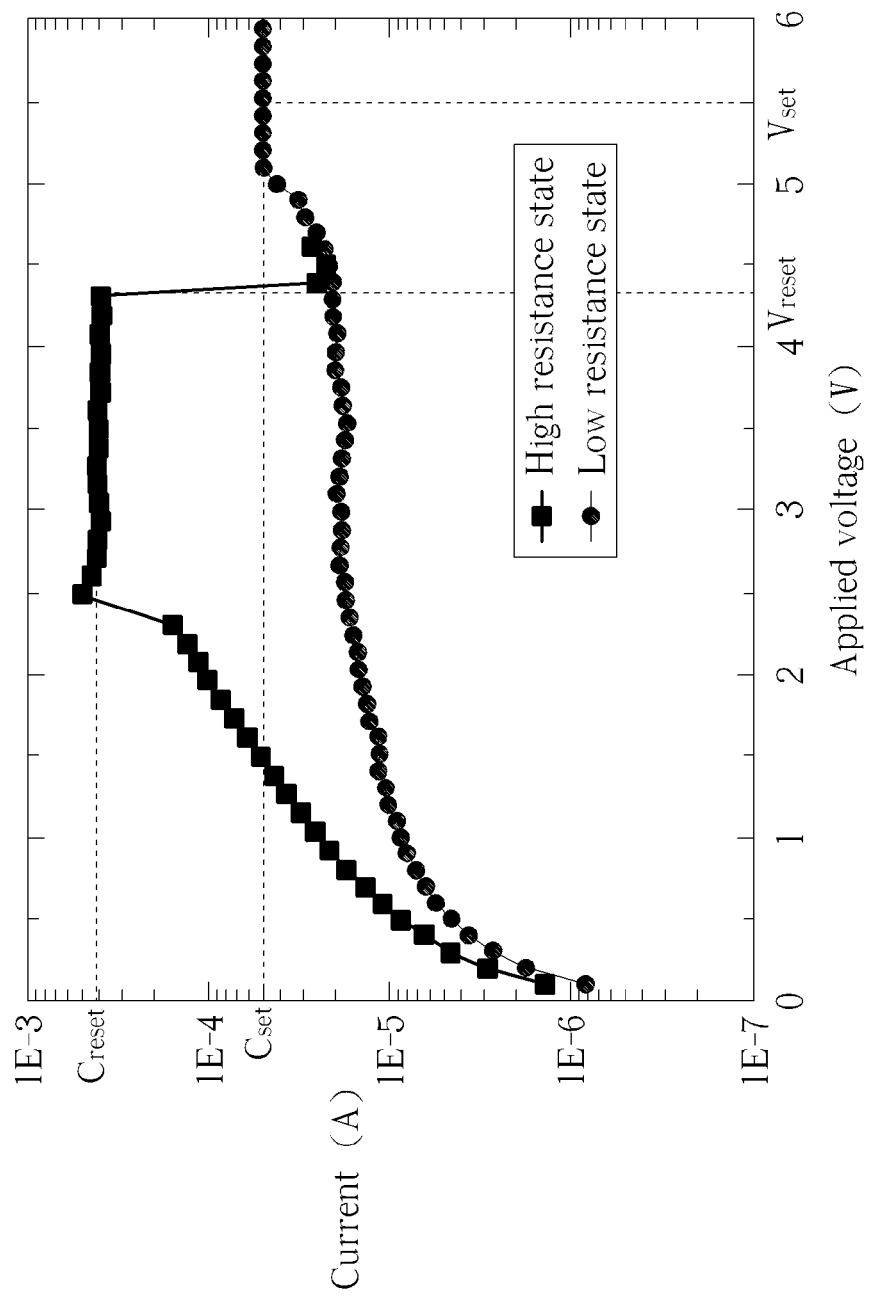
FIG. 7 is a graph illustrating an I-V curve of an RRAM using IZO irradiated with UV light as the top electrode.
Figure 8:
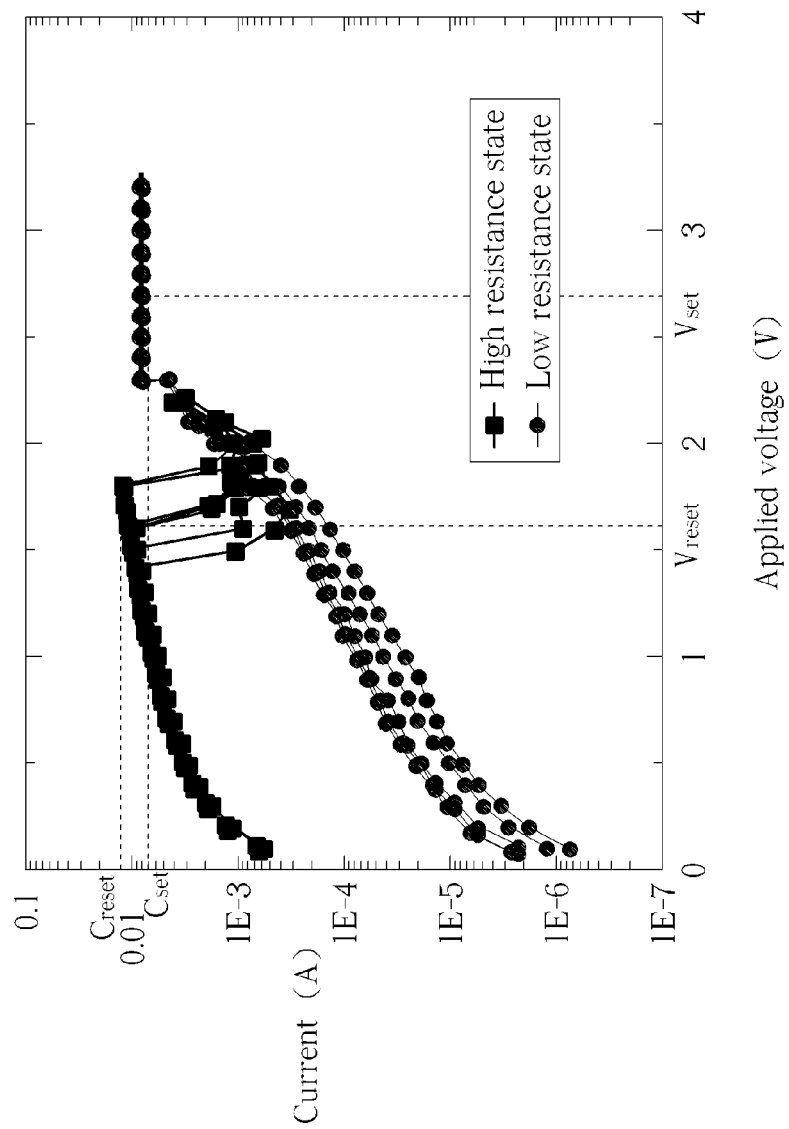
FIG. 8 is a graph illustrating an I-V curve of an RRAM using Pd as the top electrode.

FIG. 5 is a graph illustrating an I-V curve of an RRAM using ITO as the top electrode, HfO$_2$ as the resistive layer, and TiN as the bottom electrode, wherein the top electrode of the RRAM is not irradiated with UV light. FIG. 6 is a graph illustrating an I-V curve of an RRAM using ITO as the top electrode, HfO$_2$ as the resistive layer, and TiN as the bottom electrode, wherein the top electrode of the RRAM is irradiated with UV light. FIG. 7 is a graph illustrating an I-V curve of an RRAM using IZO as the top electrode, HfO$_2$ as the resistive layer, and TiN as the bottom electrode, wherein the top electrode of the RRAM is irradiated with UV light. FIG. 8 is a graph illustrating an I-V curve of an RRAM using Pd as the top electrode, HfO$_2$ as the resistive layer, and TiN as the bottom electrode. In FIG. 5 to FIG. 8, the rectangular mark denotes an I-V curve of an RRAM in a high resistance state, and the circle mark denotes an I-V curve of an RRAM in a low resistance state.

Figure 1:
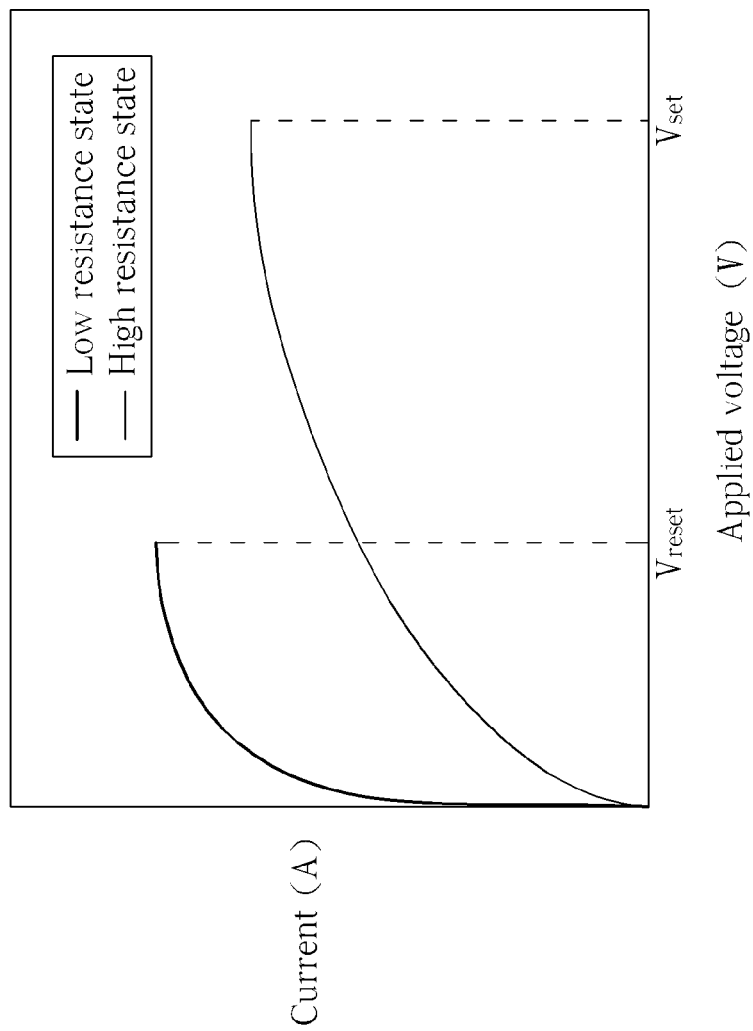
FIG. 1 is a graph illustrating an I-V curve of an ideal RRAM.

Comparing FIG. 1 with FIG. 5, it can be seen that the I-V curves of the high resistance state and the low resistance state in FIG. 5 greatly overlap each other; however, as shown in FIG. 6 and FIG. 7, the I-V curve of the high resistance state is separated from the I-V curve of the low resistance state after irradiation of the top electrode with UV light. Furthermore, as shown in FIG. 6, the RRAM using ITO as the top electrode has a V$_{set}$ voltage between 4 to 5V corresponding to a first C$_{set}$ current of 4 E-5 to 9 E-5A, and a V$_{reset}$ voltage between 3 to 4V corresponding to a first C$_{reset}$ current of 3 E-4 to 3 E-3A. As shown in FIG. 7, the RRAM using IZO as the top electrode has a V$_{set}$ voltage between 5 to 6V corresponding to a second C$_{set}$ current of 3 E-5 to 5 E-5A, and a V$_{reset}$ voltage between 4 to 5V corresponding to a C$_{reset}$ current of 3 E-4 to 5 E-4A. In addition, FIG. 8 also shows separation between the I-V curve of the high resistance state and the low resistance state. As shown in FIG. 8, the RRAM using Pd as the top electrode has a V$_{set}$ voltage between 2 to 3V corresponding to a C$_{set}$ current of 3 E-3 to 1 E-2A, and a V$_{reset}$ voltage between 1 to 2V corresponding to a C$_{reset}$ current of 6 E-3 to 2 E-2A. All in all, FIGS. 6-8 demonstrate that the RRAM using ITO or IZO irradiated with UV light as the top electrode or using Pd as the top electrode will have a good separation between the I-V curve of the high resistance state and the low resistance state. In this way, a more stable operating voltage such as set voltage or reset voltage can be reached, and signal analysis of the RRAM can be more reliable.

The present invention features the use of a transparent conductive material irradiated with UV light as the top electrode to create dangling bonds between the interface of the resistive layer and the top electrode. In this way, oxygen ions can move freely at the interface, and the resistance transformation characteristic of the RRAM is improved. Thereby, accuracy of the signal analysis of the RRAM can be increased. Furthermore, the present invention also features the use of Pd as the top electrode. Because Pd does not react with the oxygen ions at the interface between the resistive layer and the top electrode, the variation of the work function can be prevented, and current leakage can also be avoided. Furthermore, since oxygen ions can move freely into Pd, the RRAM using Pd as the top electrode has a good resistance transformation characteristic. Accordingly, reliability of the signal analysis of the RRAM can be increased.

Those skilled in the art will readily observe that numerous modifications and alterations of the device and method may be made while retaining the teachings of the invention.

What is claimed is:

1. An RRAM structure consisting of:
   a bottom electrode;
   a top electrode positioned above the bottom electrode, wherein the top electrode is selected from the group consisting of indium tin oxide (ITO) and indium zinc oxide (IZO); and
   a resistive layer sandwiched between the bottom electrode and the top electrode, wherein the RRAM structure has a first V$_{reset}$ voltage of 3 to 4V corresponding to a first C$_{reset}$ current of 3 E-4 to 3 E-3A and a first V$_{set}$ voltage of 4 to 5V corresponding to a first C$_{set}$ current of 4 E-5 to 9 E-5A in the presence of ITO serving as the top electrode, and the RRAM structure has a second V$_{reset}$ voltage of 4 to 5V corresponding to a second C$_{reset}$ current of 3 E-4 to 5 E-4A and a second V$_{set}$ voltage of 5 to 6V corresponding to a second C$_{set}$ current of 3 E-5 to 5 E-5A in the presence of IZO serving as the top electrode.

2. The RRAM structure of claim 1, wherein the bottom electrode is selected from the group consisting of Ti, TiN, Ta, W, WN, Pt, Au, Cu and AlCu.

3. The RRAM structure of claim 1, wherein the resistive layer is a stack structure comprising at least two different dielectric materials.

4. The RRAM structure of claim 1, wherein the resistive layer is selected from the group consisting of TiO, NiO, WO$_3$, ZrO, CuO, HfO, TaO, ZnO, Al$_2$O$_3$, and MoO.

5. A method of fabricating an RRAM structure consisting of a bottom electrode, a resistive layer and a top electrode, the method comprising:
   forming the bottom electrode;
   forming the resistive layer on the bottom electrode;
   forming the top electrode on the resistive layer, wherein the top electrode is selected from the group consisting of indium tin oxide (ITO) and indium zinc oxide (IZO); and
   irradiating the top electrode with UV light to form the RRAM structure, wherein the RRAM structure has a first V$_{reset}$ voltage of 3 to 4V corresponding to a first C$_{reset}$ current of 3 E-4 to 3 E-3A and a first V$_{set}$ voltage of 4 to 5V corresponding to a first C$_{set}$ current of 4 E-5 to 9 E-5A in the presence of ITO serving as the top electrode, and the RRAM structure has a second V$_{reset}$ voltage of 4 to 5V corresponding to a second C$_{reset}$ current of 3 E-4 to 5 E-4A and a second V$_{set}$ voltage of 5 to 6V corresponding to a second C$_{set}$ current of 3 E-5 to 5 E-5A in the presence of IZO serving as the top electrode.

6. The method of claim 5, wherein the wavelength of the UV light is 365 nm.

7. The method of claim 5, wherein the irradiating time of the top electrode is between 30 and 60 seconds.

8. The method of claim 5, wherein the resistive layer is selected from the group consisting of TiO, NiO, $WO_3$, ZrO, CuO, HfO, TaO, ZnO, $Al_2O_3$ and MoO.

9. The method of claim 5, wherein the bottom electrode is selected from the group consisting of Ti, TiN, Ta, W, WN, Pt, Au, Cu and AlCu.

10. The RRAM structure of claim 1, wherein the RRAM structure is operated by utilizing a unipolar voltage.

11. The method of claim 5, wherein the RRAM structure is operated by utilizing a unipolar voltage.

12. An RRAM structure consisting of:
 a bottom electrode;
 a top electrode positioned above the bottom electrode, wherein the top electrode is palladium (Pd); and
 a resistive layer sandwiched between the bottom electrode and the top electrode, wherein the RRAM structure has a $V_{reset}$ voltage of 1 to 2V corresponding to a $C_{reset}$ current of 6 E-3 to 2 E-2A and a $V_{set}$ voltage of 2 to 3V corresponding to a $C_{set}$ current of 3 E-3 to 1 E-2A.

13. The RRAM structure of claim 12, wherein the bottom electrode is selected from the group consisting of Ti, TiN, Ta, W, WN, Pt, Au, Cu and AlCu.

14. The RRAM structure of claim 12, wherein the resistive layer is selected from the group consisting of TiO, NiO, $WO_3$, ZrO, CuO, HfO, TaO, ZnO, $Al_2O_3$, and MoO.

15. The RRAM structure of claim 1, wherein the RRAM structure is a unipolar device.

16. The RRAM structure of claim 12, wherein the RRAM structure is a unipolar device.

\* \* \* \* \*